(12) United States Patent
Park et al.

(10) Patent No.: US 11,094,761 B2
(45) Date of Patent: Aug. 17, 2021

(54) ORGANIC LIGHT EMITTING DISPLAY DEVICE AND METHOD OF FABRICATING THEREOF

(71) Applicant: LG Display Co., Ltd., Seoul (KR)

(72) Inventors: Sung-Soo Park, Paju-si (KR); Nack-Youn Jung, Paju-si (KR); Hee-Jin Kim, Paju-si (KR); Hak-Min Lee, Paju-si (KR); Myung-O Joo, Paju-si (KR); Jeong-Mook Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/711,121

(22) Filed: Dec. 11, 2019

(65) Prior Publication Data

US 2020/0185472 A1 Jun. 11, 2020

(30) Foreign Application Priority Data

Dec. 11, 2018 (KR) ........................ 10-2018-0159152

(51) Int. Cl.
*H01L 27/32* (2006.01)
(52) U.S. Cl.
CPC ...... *H01L 27/3246* (2013.01); *H01L 27/3218* (2013.01)
(58) Field of Classification Search
CPC ............. H01L 27/3246; H01L 27/3218; H01L 51/0005; H01L 51/525; H01L 51/56
See application file for complete search history.

(56) References Cited

U.S. PATENT DOCUMENTS

| | | | | |
|---|---|---|---|---|
| 2009/0160322 A1* | 6/2009 | Yoshida | .............. | H01L 27/3283 313/504 |
| 2011/0108880 A1* | 5/2011 | Yanagihara | ......... | H01L 27/3246 257/100 |
| 2014/0147950 A1* | 5/2014 | Choi | ................... | H01L 51/0005 438/46 |
| 2016/0172422 A1* | 6/2016 | Kim | .................... | H01L 27/3262 257/40 |

FOREIGN PATENT DOCUMENTS

KR 10-2017-0003845 A 1/2017

* cited by examiner

*Primary Examiner* — Julia Slutsker
(74) *Attorney, Agent, or Firm* — Birch, Stewart, Kolasch & Birch LLP

(57) ABSTRACT

An organic light emitting display device and a method of fabricating thereof are discussed. The organic light emitting display device according to an example of the invention comprises a first substrate; a plurality of first bank layers arranged along a first direction and a second direction on the first substrate to define a plurality of pixels; a plurality of second bank layers disposed along the first direction on the first bank layers to divide columns of pixels having different colors; a plurality of third bank layers disposed along the second direction on the first bank layers; and an organic light emitting diode in each pixel, the organic light emitting diode including an organic light emitting layer, wherein the third bank layer is made of a same material as the second bank layer and the width of the third bank layer is smaller than that of the second bank layer.

8 Claims, 8 Drawing Sheets

ORGANIC LIGHT EMITTING DISPLAY DEVICE AND METHOD OF FABRICATING THEREOF

CROSS-REFERENCE TO RELATED APPLICATION

This application claims priority to and the benefit of Korean Patent Application No. 10-2018-0159152, filed on Dec. 11, 2018 in the Republic of Korea, the disclosure of which is incorporated herein by reference in its entirety.

BACKGROUND

1. Field of the Invention

The invention is related to a light emitting display device and a method of fabrication thereof, and more particularly to the light emitting display device having an organic light emitting layer having a uniform thickness.

2. Description of Related Art

Recently, various thin flat panel display devices have been developed to reduce weight and volume of the display device. As one of these flat panel display devices, the organic light emitting display device which comprises the organic light emitting layer for emitting the light by itself has advantages such as fast response speed, high luminous efficiency, high luminance, and wide viewing angle.

The organic light emitting layer is made of an organic light emitting material and formed by a thermal evaporation process. However, the thermal evaporation process has the follow problems.

In the thermal evaporation process, a metal mask is disposed on the front surface of the substrate to block a non-display region and then evaporate the organic light emitting material to deposit thereof on the substrate. Thus, there are many depositing processes such as a dispose and an alignment of the metal mask, evaporation of the organic light emitting material, and a removal of the metal layer to form the organic light emitting layer, so that the fabricating process is complicated, the fabricating process is delayed, and the fabricating cost is increased.

Further, an aligning device should be used to align correctly the metal mask to avoid the bad organic light emitting layer caused by the mis-alignment of the metal mask. Since the thermal evaporation device is enlarged according to the enlargement of the display device, in addition, the fabricating cost is further increased. Even when the display device becomes larger than a certain size, thermal evaporation becomes practically impossible.

SUMMARY OF THE INVENTION

An object of the invention is to provide an organic light emitting display device and a method of fabricating thereof that can implement fast and large size processes by depositing an organic light emitting layer with a coating process.

Other object of the invention is to provide an organic light emitting display device and a method of fabricating thereof having an organic light emitting layer of a uniform thickness by forming a hydrophobic bank layer between the pixels of a pixel column of the same color.

In order to achieve these objects, an organic light emitting display device can comprise a first substrate; a plurality of first bank layers arranged along a first direction and a second direction on the first substrate to define a plurality of pixels; a plurality of second bank layers disposed along the first direction on the first bank layers to divide the columns of pixels having different colors; a plurality of third bank layers disposed along the second direction on the first bank layers; and an organic light emitting diode in each pixel, the organic light emitting diode including an organic light emitting layer, wherein the third bank layer is made of same material as the second bank layer and the width of the third bank layer is smaller than that of the second bank layer.

The second and third bank layers each can have a width smaller than that of the first bank layer to expose a part of the first bank layer and the organic light emitting layer is disposed on the exposed area of the first bank layer. The first bank layer is made of a hydrophilic material and the second and third bank layers made of a hydrophobic material.

The second bank layer can be integrally formed with the third bank layer and the width of the third bank layer is dependent upon the hydrophobic property of the third bank layer.

Chamfer inclined surfaces can be formed on both corners in the upper surface of the third bank layer.

Further, a method of fabricating an organic light emitting display device can comprise forming a plurality of first bank layers along a first direction and a second direction on a substrate to define a plurality of pixels, a plurality of second bank layers along the first direction on the first bank layers to divide the columns of pixels having different colors, and a third bank layer along the second direction on the first bank layer in each pixel; forming a first electrode in the pixel; dropping an organic light emitting material in each column of pixels; flowing the dropped organic light emitting material over the third bank layer to spread the organic light emitting material into the whole area of the corresponding column of pixels; and drying the organic light emitting material to form an organic light emitting layer, wherein the third bank layer is made of same material as the second bank layer and the width of the third bank layer is smaller than that of the second bank layer.

DETAILED DESCRIPTION OF THE EMBODIMENTS

The advantages and the features of the present invention and the methods of achieving them will become apparent with reference to the embodiments described in detail below together with the accompanying drawings. The present invention may, however, be embodied in many different forms and should not be limited to the embodiments disclosed below. Rather, these embodiments are provided so that this disclosure of the present invention will be complete, and will fully convey the scope of the invention to those skilled in the art to which the preset invention pertains, and the present invention is merely defined by the scope of claims.

Hereinafter, various examples and embodiments of the invention will be described in detail accompanying drawings.

In one or more embodiments of the invention, a coating process is used to form an organic light emitting layer of an organic light emitting display device, not used by a thermal evaporation process. In this invention, for example, the organic light emitting material is dropped in a predetermined area and then the dropped organic light emitting material is spread out on the substrate to form the organic light emitting layer. Comparing to the organic light emitting layer formed by the thermal evaporation process, thus, the organic light emitting layer can be simply and rapidly formed. Further, the organic light emitting display device having a large size can be fabricated.

In particular, since a thin hydrophobic bank layer is formed in the region where the organic light emitting material is spreading in the examples of the invention, it prevents the thickness of the organic light emitting material from shrinking caused by the hydrophobic so that the thickness of the organic light emitting material coated in the corresponding region can be uniform.

Figure 1:
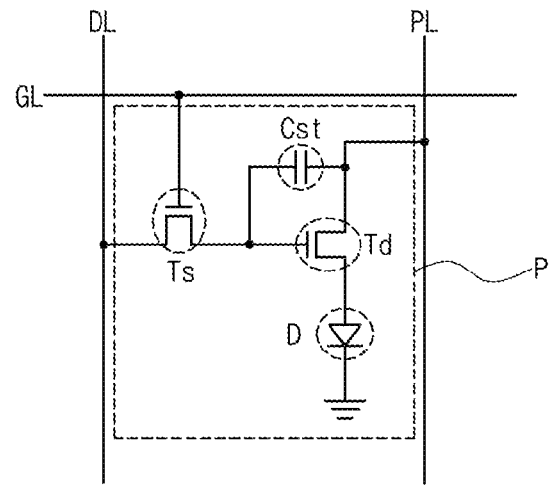
FIG. 1 is a schematic circuit of an organic light emitting display device according to one or more embodiments of the invention.

FIG. 1 is a schematic circuit of the organic light emitting display device according to one or more embodiment of the invention. All components of the organic light emitting display device according to all embodiments of the invention are operatively coupled and configured.

As shown in FIG. 1, the organic light emitting display device includes a plurality of gate lines GL and data lines DL, which are cross each other to define a plurality of pixels P, and a plurality of power lines PL. In each of the pixels P, a switching thin film transistor Ts, a driving thin film transistor Td, a storage capacitor Cst, and an organic light emitting diode D are disposed.

The switching thin film transistor Ts is connected to the gate line GL and the data line DL. The driving thin film transistor Td and the storage capacitor Cst are disposed between the switching thin film transistor Ts and the power line PL. The organic light emitting diode D is connected to the driving thin film transistor Td.

In this organic light emitting display device, the switching thin film transistor Ts is turned on by the gate signal applied to the gate line GL and then the data signal applied to the data line DL is supplied to the gate electrode of the driving thin film transistor Td and the one electrode of the storage capacitor Cst through the switching thin film transistor Ts.

The driving thin film transistor Td is turned on by the data signal applied to the gate electrode. Thus, the current proportion to the data signal is supplied to the organic light emitting diode D from the power line PL through the driving thin film transistor Td so that the organic light emitting diode D emits the light of luminance proportion to the current through the driving thin film transistor Td.

At this time, the date voltage proportion to the data signal is charged in the storage capacitor Cst, so that the gate voltage of driving thin film transistor Td is uniformly kept during one frame.

Figure 2:
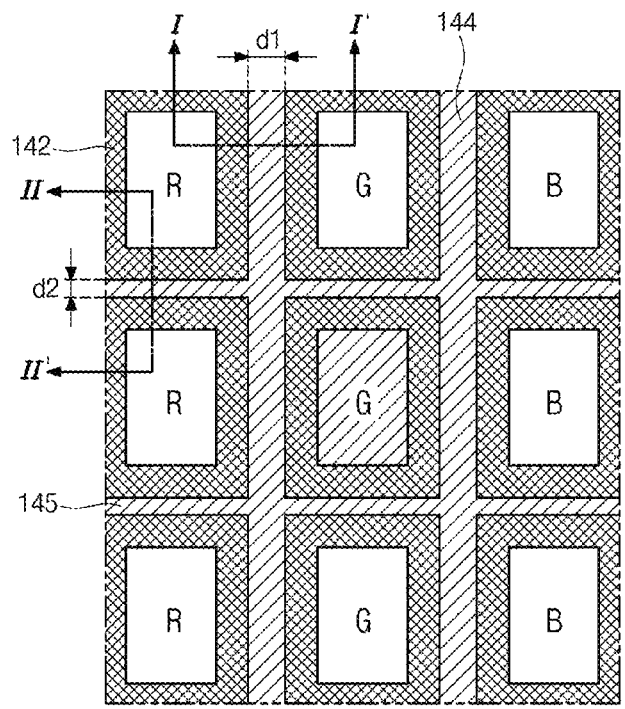
FIG. 2 is a plan view showing schematically the organic light emitting display device according to an embodiment of the invention.

FIG. 2 is a plan view showing schematically the organic light emitting display device according to an example of the invention. Each pixel of FIG. 2 can have the circuit configuration of the pixel of FIG. 1 or vice versa.

As shown in FIG. 2, a plurality of R, G, B pixels are respectively disposed in the organic light emitting display device and the R, G, B organic light emitting layers are respectively disposed in each of R, G, B pixels. Each of the R, G, B pixels are respectively arranged in strip form and then the R, G, B pixels are repeatedly disposed in the transverse direction or the longitudinal direction.

The first bank layer 142 is disposed at an outer region of each of the R, G, B pixels to distinguish the corresponding pixel from other pixels. For example, the first bank layer 142 can define one pixel having organic light emitting diode.

The second bank layer 144 is disposed between the R, G, B pixel columns which are arranged in the longitudinal direction. Since one pixel column includes a plurality of pixels of same color which are arranged in the longitudinal direction in strip form, the pixel columns of different colors are divided by the second bank layer 144. The second bank layer 144 is formed on the first bank layer 142 with a width d1 smaller than that of the first bank layer 142. The second bank layer 144 is also formed in the outermost region of the organic light emitting display device to partition the pixel region of the organic light emitting display device from the outside.

The third bank layer 145 is disposed between the pixels of same colors. For example, the third bank layer 145 is disposed between the pixel rows arranged in the order of RGBRGB. The third bank layer 145 is formed on the first bank layer 142 with a width d2 smaller than that of the first bank layer 142. The third bank layer 145 can be integrally formed with the same material as the second bank layer 144 or can be formed separately from other materials as the second bank layer 144.

Since the second bank layer 144 is disposed between the pixels of different colors, the organic light emitting materials of different colors are not mixed with the organic light emitting layer of the corresponding pixel. On the contrary, since the third bank layer 144 is disposed between the pixels of same color, the organic light emitting layer is uniformly formed in the neighboring pixels of same color.

The width d2 of the third bank layer 145 is smaller than the width d1 of the second bank layer 144 (d2<d1).

Figure 3A:
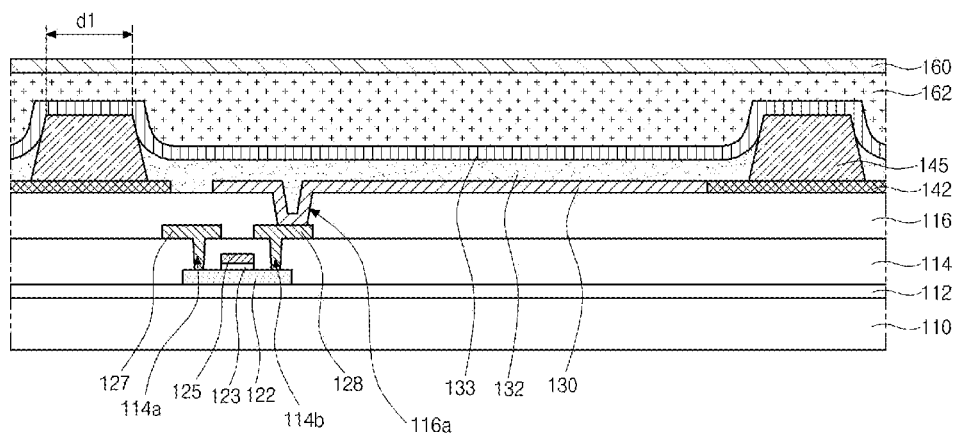
FIGS. 3A and 3B are sectional views showing respectively the structure of the organic light emitting display device according to one embodiment of the invention.
Figure 3B:
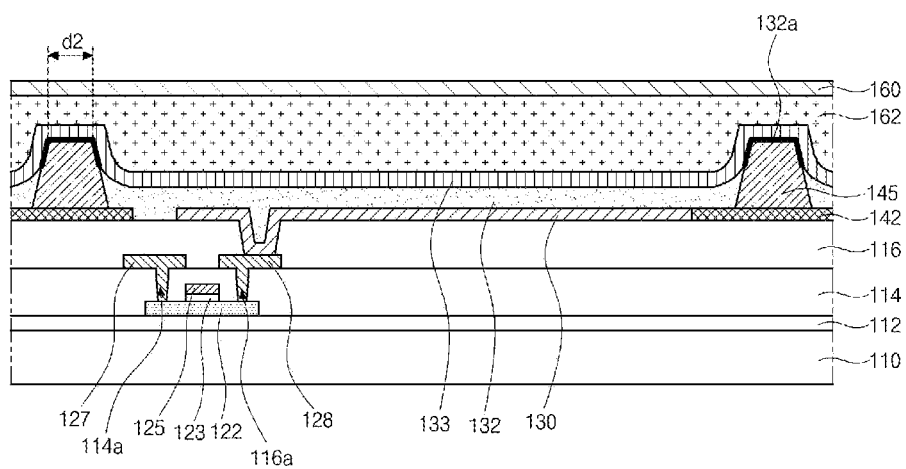

FIGS. 3A and 3B are respectively sectional views along the line I-I' and line II-II' of FIG. 2. Hereinafter, the organic light emitting display device according to one embodiment of the invention will be described in more detail with reference to the accompanying drawings.

As shown in FIGS. 3A and 3B, a buffer layer 112 is formed on a first substrate 110 and the driving thin film transistor is disposed on the buffer layer 112. The first substrate 110 can be made of a transparent material such as glass. Further, The first substrate 110 can be made of the transparent and flexible plastic such as polyimide. In addition, the buffer layer 112 can be formed of a single layer made of an inorganic material such as SiOx and SiNx, or formed of a plurality of layers made of an inorganic material such as SiOx and SiNx.

The driving thin film transistor is disposed in each pixel. The driving thin film transistor includes a semiconductor layer 122 on the buffer layer 112, a gate insulating layer 123 formed on at least a part of the semiconductor layer 122, a gate electrode 125 on the gate insulating layer 123, an interlayer 114 on the whole area of the first substrate 110 to cover the gate electrode 125, and a source electrode 127 and a drain electrode 128 on the interlayer 114 where the source electrode 127 and the drain electrode 123 are connected to the semiconductor layer 122 through a first contact holes 114a and 114b.

Further, the switching thin film transistor is disposed on the first substrate 110. The switching thin film transistor can have the same structure as the driving thin film transistor.

The semiconductor layer 122 can formed of crystalline silicon or oxide semiconductor such as indium gallium zinc oxide (IGZO). The semiconductor layer 122 includes a channel layer in the center region and a doping layer in both sides of the channel layer. The source electrode 127 and the drain electrode 128 are contacted with the doping layer.

The gate electrode 125 can be formed of a metal such as Cr, Mo, Ta, Cu, Ti, Al or Al alloy. The gate insulating layer 123 and the interlayer 114 can be formed of a single layer made of an inorganic insulating material such as SiOx or SiNx. Further, the gate insulating layer 123 and the interlayer 114 can be formed of double layers including SiOx layer and SiNx layer. The source electrode 127 and the drain electrode 128 can be formed of Cr, Mo, Ta, Cu, Ti, Al, or Al alloy.

Although the driving thin film transistor has a specific structure in the drawings and the above description, the driving thin film transistor of the invention is not limited to the illustrated structure, and any driving thin film transistor of any structure can be applied.

On the driving thin film transistor, a passivation layer 116 is formed. The passivation layer 116 can be formed of the organic material such as a photo-acryl. Further, the passivation layer 116 can be formed of a plurality of layers including inorganic layer and organic layer. A second contact hole 116a is formed in the passivation layer 116.

On the passivation layer 116, a first electrode 130 is formed and connected electrically to the drain electrode 128 of the driving thin film transistor through the second contact hole 116a. The first electrode 130 can be formed of single layer or a plurality of layers made of the metal such as Ca, Ba, Mg, Al, Ag, or an alloy thereof. The first electrode 130 is connected to the drain electrode 128 of the driving thin film transistor to apply an image signal from the outside.

The first bank layer 142, the second bank layer 144, and the third bank layer 145 are formed at the boundary between the pixels on the passivaton layer 116. The first bank layer 142, the second bank layer 144, and the third bank layer 145 each serves as a barrier layer partitions each pixel(P) to prevent the mixture of the light of different colors from the neighboring pixels.

As shown, the first bank layer 142 is formed on the passivation layer 116, the second and third bank layers 144 and 145 are formed on the first bank layer 142, the first electrode 130 is spaced apart from the first bank layer 142 by a predetermined distance. However, the first bank layer 142 can be on the first electrode 130 to overlap the first electrode 130 with the first bank layer 142.

Further, the first electrode 130 can extend to the side surfaces of the first bank layer 142, the second bank layer 144, and the third bank layer 145, so that the first electrode 130 can be formed at the corner between the upper surface of the first bank layer 142 and the side surfaces of the second and third bank layers 144 and 145. As the first electrode 130 is formed at the corner of the bank layers 142, 144, and 145, an area where no voltage is applied is removed, so that a dead area where an image is not implemented can be removed from the display device.

The organic light emitting layer 132 is formed on the first electrode 130 in the each pixel. As described in detail later, the organic light emitting layer 132 can be formed by coating and drying the organic light emitting material in a solution state on the first electrode 130, not the thermal evaporation process. The organic light emitting layer 132 can be an R-organic light emitting layer formed on the R pixel, a G-organic light emitting layer formed on the G pixel, and a B-organic light emitting layer formed on the B pixel to emit respectively red light, green light, and blue light.

Although the organic light emitting layer 132 is formed in only one pixel P in the figure, the organic light emitting layer is substantially formed over a plurality of pixels of same color arranged in the strip form. Thus, the organic light emitting layer 132 is not formed to have a predetermined thickness in the plurality of pixels P and then a variation occurs in thicknesses of the outer region and the center region of the display device. The thickness variation of the organic light emitting layer 132 is caused by coating and drying of the organic light emitting layer 132.

When the coated organic light emitting materials in the solution state is dried, the solvent in the organic light emitting material is removed by evaporation and only the organic light emitting material remains. Since the evaporation rate of the solvent in the outer region of the display device is greater than that in the central region of the display device, the organic light emitting material in the outer region of the display device is dried first. Accordingly, a portion of the organic light emitting material of the un-dried central region is spread to the outer region, so that the thickness deviation between the outer region and the central region of the display device occurs.

The organic light emitting layer 132 can includes a light emitting layer, an electron injecting layer and a hole injecting layer for injecting respectively electrons and holes into the light emitting layer, and an electron transporting layer and a hole transporting layer for transporting respectively the injected electrons and holes to the light emitting layer.

The first bank layer 142 is formed at the boundary of every pixel P to define an area of the pixel P, and the second bank layer 144 is disposed between the pixels P of different colors to divide the pixels P of different colors. Accordingly, the organic light emitting layers 132 having different colors are formed in the region at both side of the second bank layer 144. When the organic light emitting layer 132 is formed, the organic light emitting materials of different color are not mixed to each other by the second bank layer 144.

Further, the third bank layer 145 is disposed between the pixels P of the same color. Accordingly, the organic light emitting layer 132 of same color is formed in the pixel at both sides of the third bank layer 145. By the third bank layer 145, the organic light emitting layer 132 having a uniform thickness is formed on the pixels P arranged along the pixel column.

On the other hand, the organic light emitting layer 132 extends to the top surface and side surface of the third bank layer 145, so that the thin organic light emitting layer 132a is formed thereon.

A second electrode 133 is formed on the organic light emitting layer 132 and the bank layers 142,144, and 145. The second electrode 133 can be made of transparent conductive material such as Indium Tin Oxide (ITO) and Indium Zinc Oxide (IZO) or the thin metal for passing visual light therethrough. However, the second electrode 133 is not limited these materials.

An adhesive layer 162 is deposited on the second electrode 133, and a second substrate 160 is disposed on the adhesive layer 162 so that the second substrate 160 is attached to the display device. As the adhesive layer, any material can be used as long as it has good adhesion and heat resistance and water resistance. A thermosetting resin such as an epoxy compound, an acrylate compound, or an acrylic rubber can be used as the adhesive layer 162. Further, a photo-curable resin can be used as the adhesive layer 162. In this case, the adhesive layer 162 is cured by irradiating the adhesive layer 162 with light such as ultraviolet rays.

The adhesive layer 162 may not only bond the first substrate 110 and the second substrate 160, but also encapsulate display device to block the moisture thereto. Although the reference number 162 is called as the adhesive layer for convenience, the reference number 162 can be called as encapsulant.

The second substrate 160 is an encapsulation cap for encapsulating the organic light emitting display device. The second substrate 160 can be made of protection film such as a polystyrene film, polyethylene film, polyethylene naphthalate film, or polyimide film. Further, the second substrate 160 can made of a glass.

A planarization layer can be disposed between the second electrode 133 and the adhesive layer 162. The planarization layer can be formed of a single organic layer or a plurality of layers of inorganic layer and organic layer. For example, the inorganic layer can be made of SiOx or SiNx and the organic layer can be made of photo-acryl. However, the planarization layer is not limited these materials.

The first electrode 130, the organic light emitting layer 132, and the second electrode 133 form an organic light emitting diode. The first electrode 130 is a cathode of the organic light emitting diode and the second electrode 133 is an anode of the organic light emitting diode. When voltage is applied to the first electrode 130 and the second electrode 133, the electrons are injected into the organic light emitting layer 132 from the first electrode 130, and the holes are injected into the organic light emitting layer 132 from the second electrode 133. By the electrons and the holes, excitons are generated in the organic light emitting layer 132. As these excitons decay, light corresponding to the energy difference between Low Unoccupied Molecular Orbital (LUMO) and Highest Occupied Molecular Orbital (HOMO) of the light emitting layer is generated and emitted to the outside of the second substrate 160.

Further, the first electrode 130 is made of a transparent conductive material such as ITO or IZO or a metal having a thin thickness through which visible light is transmitted, and the second electrode 133 is formed of single layer or a plurality of layers made of metal such as Ca, Ba, Mg, Al, Ag, or the like. The light generated in the organic light emitting layer 132 can be emitted to the outside of the first substrate 110.

In the organic light emitting display device of the present invention, not only the organic light emitting diode having the above structure but also various organic light emitting diode currently known can be applied.

In this organic light emitting display device, each of the pixel P is divided by the bank layer and the organic light emitting diode having R,G,B-organic light emitting layers are in each pixel.

In this invention, the bank layer is formed in the double layers of the first bank layer 142 and the second bank layer 144 thereon. Further, the bank layer is formed in the double layers of the first bank layer 142 and the third bank layer 146 thereon. In this invention, in particular, the first bank layer 142 is made of hydrophilic material and the second and third bank layers 144 and 145 are made of hydrophobic material. At that time, the width of the first bank layer 142 is larger than that of each of second and third bank layers 144 and 145, so that the first bank layer 142 is exposed through both sides of the second and third bank layers 144 and 145 and the organic light emitting layer 132 is disposed on the first electrode 130 and the exposed area of the first bank layer 142.

The organic light emitting layer 132 is not formed on the upper surface of the second bank layer 144, but a thin organic light emitting layer 132a is formed on the upper surface of the third bank layer 145. This is because the width d2 of the third bank layer 145 is formed smaller than the width d1 of the second bank layer 144 (d2<d1). Hereinafter, the reason why the thin organic light emitting layer 132a is formed only on the top surface of the third bank layer 145, not formed on the top surface of the second bank layer 144 will be described in more detail.

Figure 4:
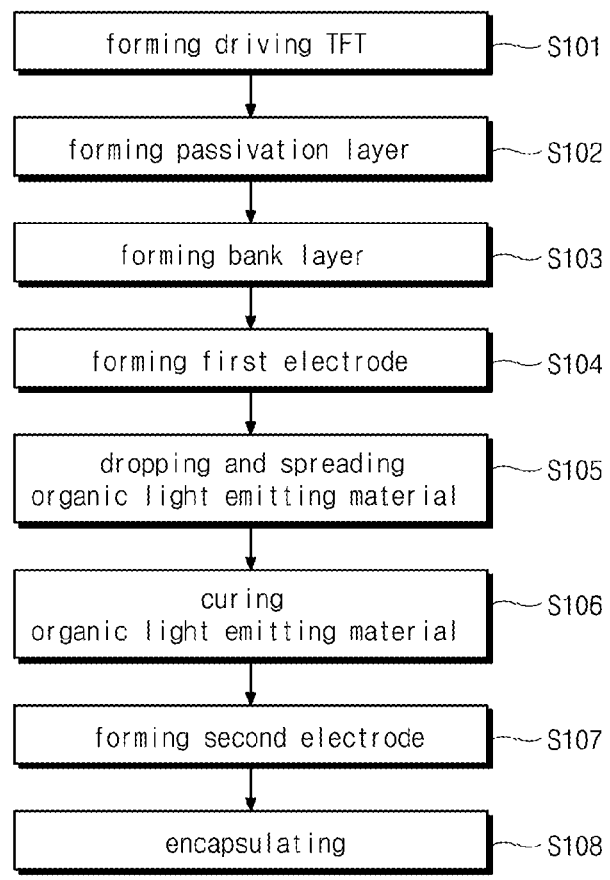
FIG. 4 is a flow chart showing a fabrication process of the organic light emitting display device according to one embodiment of the invention.

FIG. 4 is a flow chart showing a fabrication process of the organic light emitting display device according to one embodiment of the invention.

As shown in FIG. 4, the buffer layer 112 is first formed on the first substrate and then the driving thin film transistor including the semiconductor layer 122, the gate insulating layer 123, the gate electrode 125, the interlayer 114, the source electrode 127, and the drain electrode 128 is formed on the buffer layer 112 (S101).

Thereafter, the organic material such as photo-acryl is deposited over the whole area of the first substrate 110 having the driving thin film transistor to form the passivation layer 116 (S102) and then the first, second, and third bank layers 142,144, and 145 are formed on the passivation layer (S103).

In this case, the first bank layer 142 is formed along the traverse and longitudinal directions of the first substrate 110 so that the first bank layer 142 is disposed along the circumference of the all the pixels P of the organic light emitting display device to divide all the pixels from the other pixels. The second bank layer 144 is formed along the longitudinal direction of the first substrate 110 to divide the pixels P of same color from the pixels P of different colors. Further, the third bank layer 145 is formed along the traverse direction of the first substrate 110 so that the third bank layer 145 is disposed between the pixels P of same color.

Subsequently, the first electrode 130 is formed in each pixel (S104) and then the organic emitting material is dropped and cured to form the organic light emitting layer 132 (S105 and S106).

Since the first electrode 130 is formed in unit of the first bank layer 142, for example, pixel unit, the first electrode 130 is separated between the neighboring pixels. Since the organic light emitting layer 132 is formed in unit of the second bank layer 144, that is, unit of pixel column, the organic light emitting layer 132 is continuously formed in a plurality of pixels P arranged in longitudinal direction. Since the third bank layer 145 is disposed between the pixels of unit of pixel column, the thin organic light emitting layer 132a is formed on the third bank layer 145 during the organic light emitting layer 132 is formed.

Thereafter, the second electrode 133 is formed on the organic light emitting layer 132 and then encapsulated to complete the organic light emitting display device (S107 and S108).

As described above, in the organic light emitting display device according to an embodiment of the invention, the organic light emitting material is coated in the area partitioned by the first bank layer 142 and the second bank layer 144 and dried (or cured) to form the organic light emitting layer 132, the coating method of the organic light emitting material will be described with FIG. 5.

Figure 5:
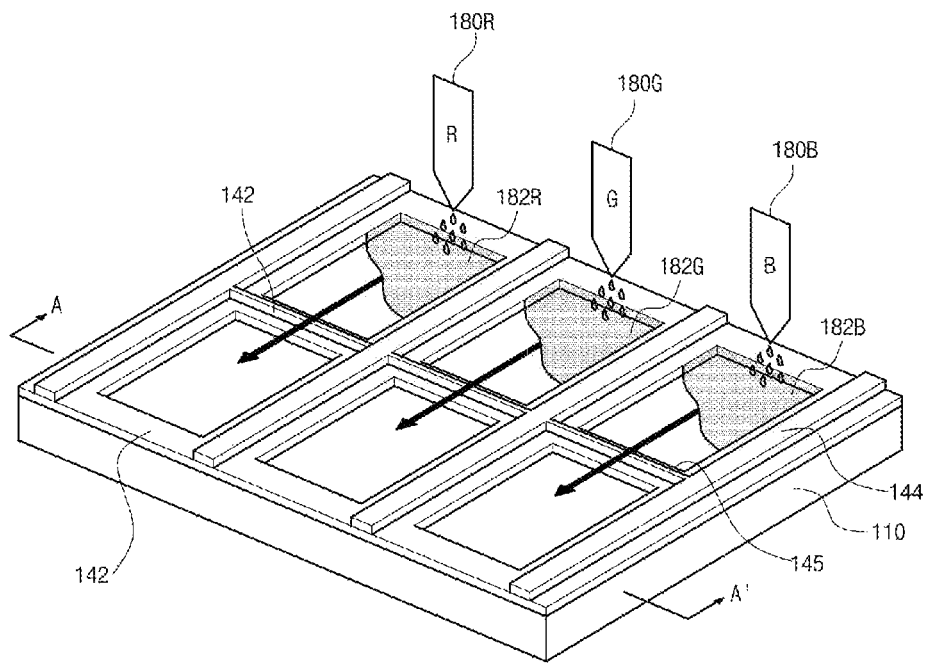
FIG. 5 is a view showing a coating process of the organic light emitting material of the organic light emitting display device according to the one embodiment of the invention.

FIG. 5 is a view showing an example of the coating process of the organic light emitting material of the organic light emitting display device according to the one embodiment of the invention. In the figure, only the first bank layer 142, the second bank layer 144, and the third bank layer 145 on the first substrate 110 are shown for convenience of description, and other components such as a thin film transistor are omitted.

As shown in FIG. 5, a plurality of R,G,B, pixels are formed on the first substrate 110. A plurality of pixels of same color are arranged in the strip form in the first direction (for example, the longitudinal direction) and the plurality of pixels of different colors are alternatively arranged in the second direction (for example, RGBRGB in the traverse direction).

The first bank layer 142 is formed along the first and second directions of the first substrate 110 so that the first bank layer 142 is disposed along the circumference of the all the R,G,B pixels. The second bank layer 144 is formed along the first direction on the first bank layer 142 and thus the second bank layer 144 is disposed between the pixels of different colors, for example, between the R pixel column and the G pixel column, between the G pixel column and the B pixel column, and between the B pixel column and the R pixel column. Further, the third bank layer 145 is formed along the second direction on the first bank layer 142 so that the third bank layer 145 is disposed between the pixels of same color.

The second bank layer 144 and the third bank layer 145 are integrally formed of same material, but can be separately formed of different material (but all the material of the second bank layer 144 and the third bank layer 145 have hydrophobic characteristics).

After the first, second, and third bank layers 142, 144, and 145 are formed, a dispensing device having a first dispenser 180R, a second dispenser 180G, and a third dispenser 180B containing respectively a R-organic light emitting material 182R, G-organic light emitting material 182G, and a B-organic light emitting material 182B is disposed over at least one position of each of R-pixel column, G-pixel column, and B-pixel column defined by the second bank layer 144. Then, the organic light emitting material 182R, 182G, and 182B of predetermined amount is dropped at each of pixel columns.

Each of the first to third dispensers 180R, 180G, and 180B includes a nozzle for opening and closing at the predetermined period to dispense the organic light emitting material 182R, 182G, and 182B of desired amount on the first substrate 110. At this time, the nozzle of the dispensers 180R, 180G, and 180B can be opened for a relatively short time and small amounts of the organic light emitting materials 182R, 182G, and 182B are dropped several times. Further, a desired amount of the organic light emitting materials 182R, 182G, and 182B can be dropped once.

As shown in figure, the first to third dispenser 180R, 180G, and 180B are respectively disposed in each pixel column so that the organic light emitting materials 182R, 182G, and 182B are dropped in only one position of the corresponding pixel. Further, a plurality of first to third dispensers 180R, 180G, and 180B can be disposed in each pixel column and then the organic light emitting materials 182R, 182G, and 182B can be dropped in a plurality of positions of each corresponding pixel columns. In addition, the first to third dispenser 180R, 180G, and 180B can move to drop the organic light emitting materials 182R, 182G, and 182B at a plurality of positions of each pixel column.

As described above, by dropping the organic light emitting material at a plurality of positions of one pixel column, the organic light emitting layer can be quickly formed even in a large area organic light emitting display device.

Meanwhile, in the invention, various devices such as a slit coater having slit for discharging the organic light emitting material 182R, 182G, and 182B and a drop coater for dropping the organic light emitting material 182R, 182G, and 182B of predetermined amount can be used as the dispensing device.

The organic light emitting material 182R, 182G, and 182B dropped in the pixel column is spreading along the pixel column arranged in the first direction. In this case, the first bank layer 142 and the second bank layer 144 are disposed between the pixels of different colors in the first direction. Further, the first bank layer 142 and the third bank layer 145 are disposed between a plurality of pixels of pixel column arranged along the first direction.

Although the height of the first and second bank layers 142 and 144 arranged along the first direction is identical with the height of the first and third bank layers 142 and 145 arranged along the second direction, the organic light emitting material 182R, 182G, and 182B is blocked by the first and second bank layers 142 and 144 and do not spread in the second direction, whereas the organic light emitting material 182R, 182G, and 182B is spread in the first direction without blocking the flow by the first and third bank layers 142 and 145. For example, the organic light emitting materials 182R, 182G, and 182B spread over the third bank layer 145 in the first direction, because the width d2 of the third bank layer 145 is smaller than width d1 of the second bank layer 144 (d2<d1).

Figure 6A:
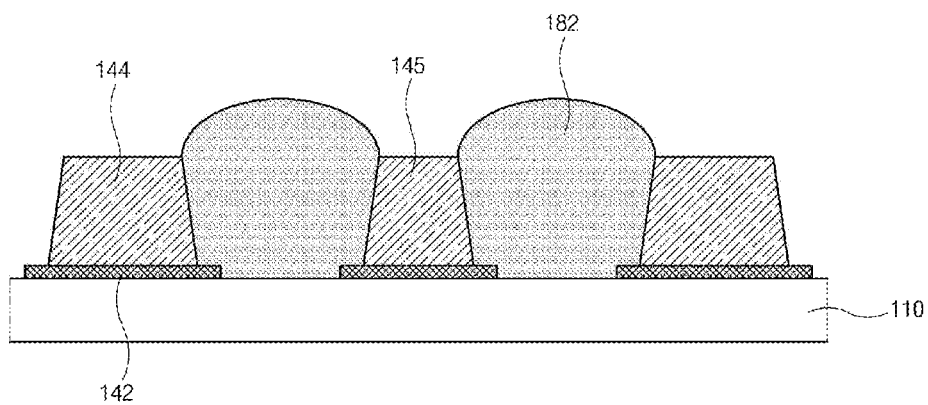
FIGS. 6A and 6B are views showing respectively the organic light emitting material spreading and overflowing a third bank layer when the organic light emitting material is coated in one embodiment of the invention.
Figure 6B:
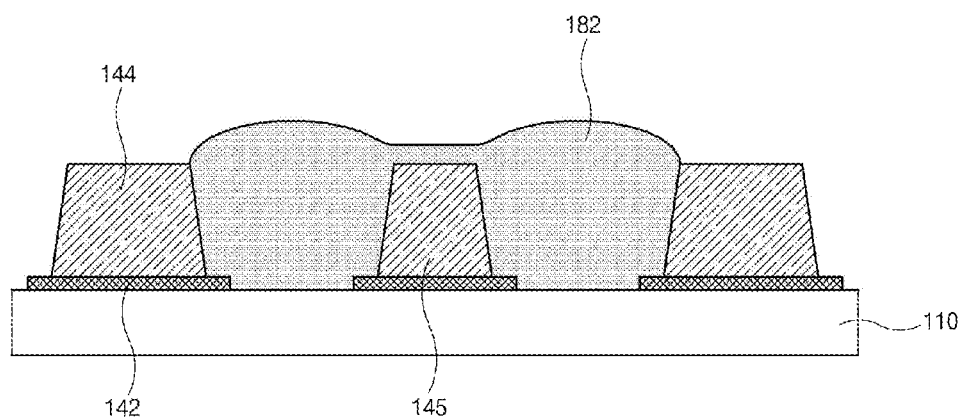

FIGS. 6A and 6B are views showing respectively an example of the organic light emitting material 182R, 182G, and 182B overflowing the third bank layer 145 in the pixel column and spreading in the first direction when the organic light emitting material 182R, 182G, and 182B is spreading along the pixel column.

As shown in FIG. 6A, when the organic light emitting materials 182R, 182G, and 182B are dropped in the pixels and spread along the pixel columns, the organic light emitting materials 182R, 182G, and 182B form a droplet at the upper portion of the third bank layer 145 by the surface tension caused by van der Waals forces in the solution. As the organic light emitting materials 182R, 182G, and 182B continue to spread, the amount of organic light emitting materials 182R, 182G, and 182B introduced into the pixel increases. Therefore, the droplets of the organic light emitting materials 182R, 182G, and 182B formed in the adjacent pixels with the third bank layer 145 therebetween become large, so that the light emitting materials 182R, 182G, and 182B spread over the third bank layer 145.

For example, the organic light emitting materials 182R, 182G, and 182B flow over the third bank layer 145 formed in the pixel column and then spread to all pixels of the R,G,B pixel columns. As shown in FIG. 6B, specially, the organic light emitting materials 182R, 182G, and 182B is coated to cover the third bank layer 145 formed in the middle region of the R,G,B pixel column and the organic light emitting material 182R, 182G, and 182B coated to the upper portion of the third bank layer 145 increases a predetermined distance upward from the third bank layer 145 due to the hydrophobic property of the third bank layer 145. Accordingly, since the thickness of the organic light emitting material 182R, 182G, and 182B coated in a droplet shape near the second bank layer 144 disposed at the outermost region of the R,G,B pixel columns is almost same as the thickness of the organic light emitting material 182R, 182G, and 182B raised by the third bank layer 145 formed in a plurality of regions of R,G,B pixel columns, the organic light emitting materials 182R, 182G, and 182B are uniformly deposited over the entire pixel column.

Meanwhile, the droplet shape of the organic light emitting materials 182R, 182G, and 182B is also formed in the second bank layer 144 due to the surface tension of the organic light emitting materials 182R, 182G, and 182B. Since the width d1 of the second bank layer 144 is larger than the width d2 of the third bank layer 145 (d1>d2), however, the droplet shape of the organic light emitting materials 182R, 182G, and 182B of different color formed in the adjacent pixels are not contacted to each other. Thus, the organic light emitting materials 182R, 182G, and 182B cannot be flow over the second bank layer 144 so that the organic light emitting materials 182R, 182G, and 182B of different colors are not mixed with each other.

In this regard, the width d2 of the third bank layer 145 can be set to allow the organic light emitting materials 182R, 182G, and 182B dropped on the adjacent pixels to flow over the third bank layer 145 by surface tension. In other word, the width d2 of the third bank layer 145 can be determined in accordance with the material of the third bank layer 145 and the characteristics of the organic light emitting materials 182R, 182G, and 182B. In particular, since the surface tension of the organic light emitting materials 182R, 182G, and 182B depends on the hydrophobicity of the third bank layer 145, the width d2 of the third bank layer 145 can be determined in accordance with the hydrophobicity of the third bank layer 145. For example, if the hydrophobicity of the third bank layer 145 become stronger, the organic light emitting materials 182R, 182G, and 182B flow over the third bank layer 145 even if the width d2 of the third bank layer 145 is increased. As a result, the organic light emitting materials 182R, 182G, and 182B can be deposited over entire R,G,B pixel columns. In even case where the second bank layer 144 and the third bank layer 145 are formed to have the same width (d1=d2), the organic light emitting materials 182R, 182G, and 182B flow and spread over the third bank layer 145, but may not flow over the second bank layer 144, if the hydrophobicity of the third bank layer 145 becomes much stronger than that of the second bank layer 144.

In the figure, only two adjacent pixels are described as examples for convenience of the explanation, but the organic light emitting materials 182R, 182G, and 182B flow and spread over a plurality of the third bank layer 145 formed in each of the R,G,B pixel columns.

In this invention, as described above, since the a plurality of the hydrophobic third bank layer are formed in the pixel column of same color and the organic light emitting materials 182R, 182G, and 182B covers the third bank layer 145, the organic light emitting materials can be uniformly deposited over the entire R,G,B pixel columns.

Figure 8A:
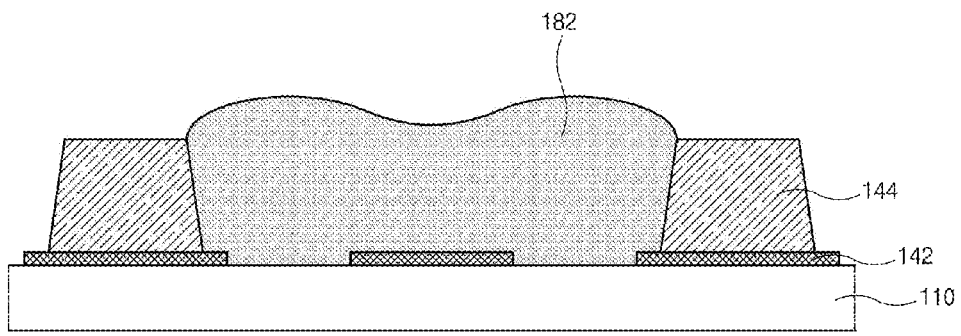
FIG. 8A is a view of coating the organic light emitting material without the third bank layer according to another example of the invention.

FIG. 8A illustrates the organic light emitting materials 182R, 182G, and 182B coated to the R pixel column, the G pixel column, and the B pixel column without the third bank layer 145. In this case, since the third bank layer 145 is not present, the organic light emitting materials 182R, 182G, and 182B are coated in a curved shape with curvature near the second bank layer 144 in the outermost region due to the surface tension, but organic light emitting materials 182R, 182G, and 182B are coated in the concave shape in the middle area within the R pixel column, the G pixel column, and the B pixel column. In this structure, therefore, the thickness variations of the organic light emitting materials 182R, 182G, and 182B occurs in the outer region and the middle region of the R pixel column, the G pixel column, and the B pixel column.

In the invention, as shown FIG. 6B, the organic light emitting materials 182R, 182G, and 182B coated in the middle area of the R pixel column, the G pixel column, and the B pixel column are raised upwards and then the organic light emitting materials 182R, 182G, and 182B are uniformly coated over the entire the R pixel column, the G pixel column, and the B pixel column, due to the hydrophobic characteristics of the plurality of third bank layers 145. In the structure shown in FIG. 8A, on the contrary, the thickness variation of the organic light emitting materials 182R, 182G, and 182B between the outer region and the middle region of the R pixel column, the G pixel column, and the B pixel column is very big.

Figure 8B:
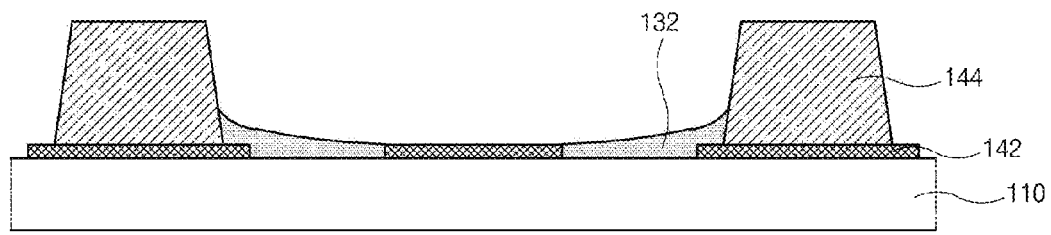
FIG. 8B is a view of the organic light emitting layer formed without the third bank layer according to another example of the invention.

In the structure without the third bank layer 145, as shown in FIG. 8B, since the thickness variation of the organic light emitting materials 182R, 182G, and 182B between the outer region and the middle region of the R pixel column, the G pixel column, and the B pixel column is very big, the thicknesses of the organic light emitting layers 132 formed on the pixels arranged in the R pixel columns, the G pixel columns, and the B pixel columns are different from each other, and the thicknesses of the organic light emitting layers 132 are different within one pixel, when the organic light emitting materials 182R, 182G, and 182B are dried.

Figure 7:
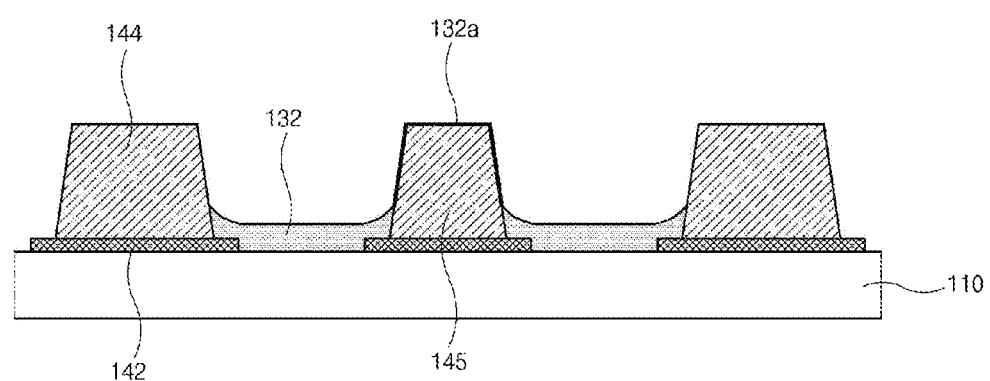
FIG. 7 is a view of the organic light emitting layer according one embodiment of the invention.

However, the organic light emitting materials 182R, 182G, and 182B are uniformly deposited in the entire R pixel columns, the G pixel columns, and the B pixel columns in the invention. Thus, the organic light emitting layer 132 has uniform thickness as shown in FIG. 7, when the solvent contained in the organic light emitting materials 182R, 182G, and 182B is removed by drying thereof. At this time, since the organic light emitting materials 182R, 182G, and 182B applied on the third bank layer 145 are also dried, the thin organic light emitting layer 132a is formed on the top and side surfaces of the third bank layer 145.

As described above, in one or more embodiment of the present invention, the organic light emitting layer is formed by a coating process rather than a thermal deposition process. In particular, in the invention, the first bank layer 142 is formed along the second direction, and the double bank layers of the first bank layer 142 and the second bank layer 144 are formed along the first direction (pixel column direction) between pixels of different colors. Therefore, the organic light emitting materials 182R, 182G, and 182B are coated to the plurality of pixels disposed in each of the R, G, and B pixel columns at the same time, so that the organic light emitting materials 182R, 182G, and 182B can be rapidly coated.

When the bank layer is made of a single layer, all the pixels are made of bank layers of the same height and all the pixels are separated from adjacent pixels by a single bank layer. Therefore, in order to form the organic light emitting layer 132 by the dropping method, the organic light emitting materials 182R, 182G, and 182B should be dropped independently of each pixel. In other words, dropping must be performed a number of times corresponding to the number of pixels. On the other hand, in the invention, since the organic light emitting materials 182R, 182G, and 182B are respectively coated to a plurality of pixels arranged in corresponding pixel columns arranged along the first direction by one drop, the organic light emitting layer 132 can be rapidly formed comparing to the structure having the single bank layer.

Further, in the invention, the hydrophobic third bank layer 145 is formed between pixels of the same color. Therefore, when the organic light emitting materials 182R, 182G, and 182B are coated to the R, G, and B pixel columns, respectively, it can be prevented to reduce the thickness of the organic light emitting materials 182R, 182G, and 182B in the corresponding region, that is, the middle region of the R, G, and B pixel columns due to the hydrophobicity of the third bank layer 145. As a result, the organic light emitting layer 132 having a uniform thickness can be formed over the entire R, G, and B pixel columns.

Figure 9A:
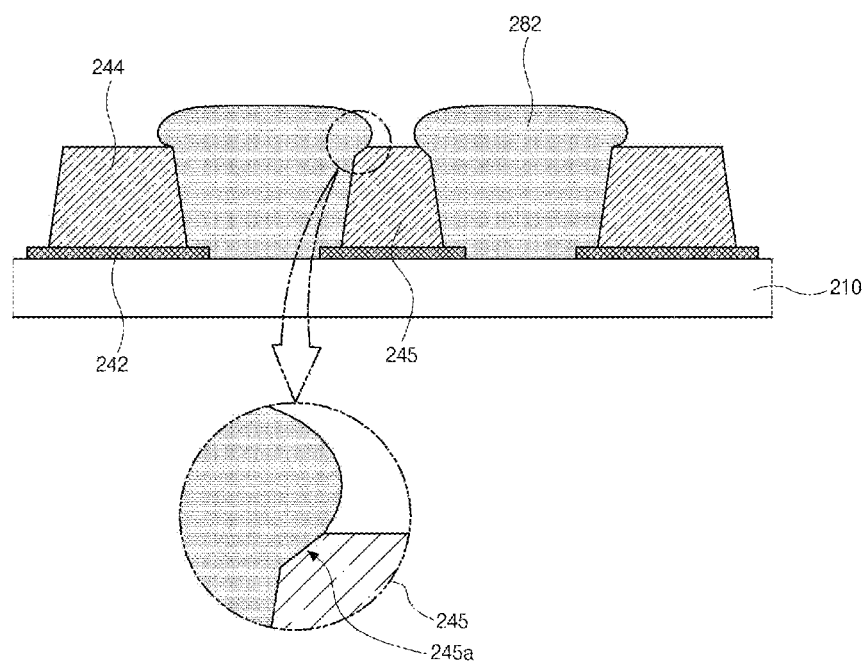
FIGS. 9A and 9B are sectional views showing respectively the structures of the bank layer according to other embodiment of the invention.
Figure 9B:
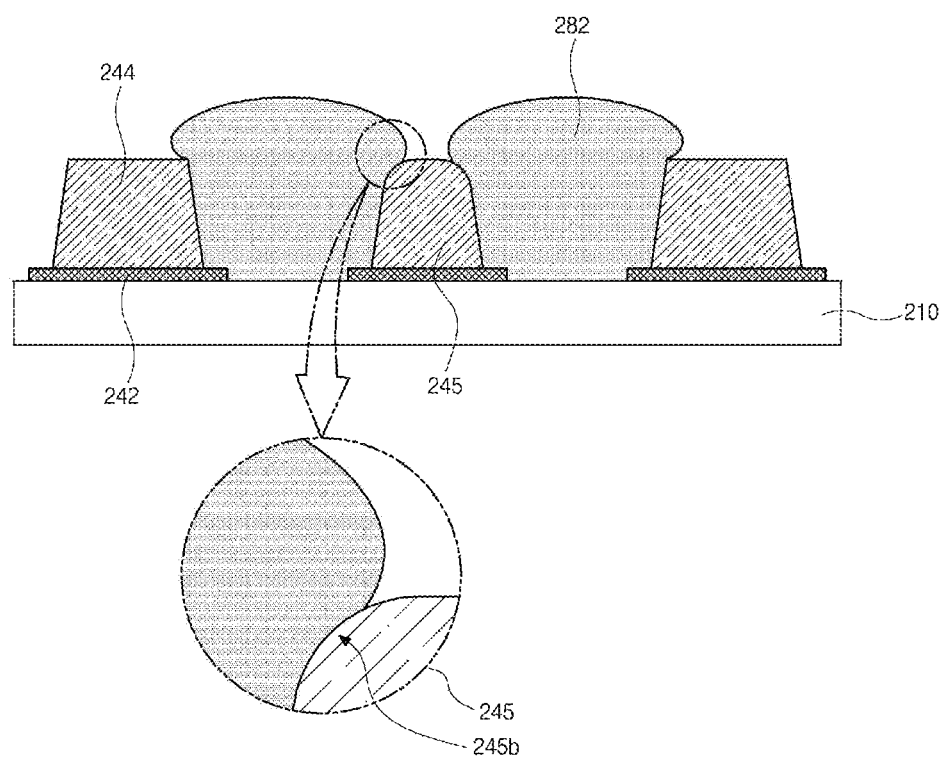

FIGS. 9A and 9B are sectional views showing respectively the structures of the bank layder according to other embodiment of the invention. The organic light emitting display device of this embodiment differs from the organic light emitting display device having the structure shown in FIGS. 3A and 3B only in the shape of the third bank layer 245 and the other structure are the same. The description will be omitted and only the third bank layer 245 will be described in detail.

As shown in FIG. 9A, the first bank layer 242 is formed over the first substrate 210, and the second bank layer 244 and the third bank layer 245 are formed on the first bank layer 242. The first bank layer 242 is formed at the outer region of all the pixels to define the pixel. The second bank layer 244 is formed between the R,G,B pixel columns and at the outer region of the pixel region including pixels. The third bank layer 245 is formed within the R,G,B pixel columns to be disposed between the pixels of same color in each of R,G,B pixel columns.

The first bank layer 242 is made of a hydrophilic material, and the second bank layer 244 and the third bank layer 245 are made of a hydrophobic material. Further, the second bank layer 244 and the third bank layer 245 can be formed to have a smaller width than the first bank layer 242 so that a part area of the first bank layer 242 is exposed when the second bank layer 244 and the third bank layer 245 are disposed on the first bank layer 242.

The third bank layer 245 has a width smaller than that of the second bank layer 244. In particular, the left and right edges (or both corners) of the upper surface of the third bank layer 245 are formed with the chamfered inclined surface 245a. The inclined surface 245a is formed so as to bring the droplet shape formed by the surface tension upon coating of the organic light emitting materials 282 to the adjacent pixel. For example, the position of the droplet shape formed by the surface tension is disposed to be closer to the adjacent pixel side. Therefore, since the inclined surface 245a is formed at the corners adjacent to the neighboring pixels of the same color, the droplets of the organic light emitting materials 282 formed in the adjacent pixels are more easily in contact with each other, so that the organic light emitting materials 282 coated along each of the R, G, and B pixel columns can easily flow and spread over the third bank layer 245.

As shown in FIG. 9B, the left and right edges (or both corners) of the third bank layer 245 which is adjacent to the neighboring pixels of same color can be formed as a curve 245b. By this curve 245b, the droplets of the organic light emitting materials 282R, 282G, and 282B formed in the adjacent pixels are more easily in contact with each other, so that the organic light emitting materials 282 coated along each of the R, G, and B pixel columns can easily flow and spread over the third bank layer 245.

In this organic light emitting display device, since the organic light emitting material 282 is coated uniformly throughout due to the hydrophobic third bank layer 245 arranged along the R, G, and B pixel columns, the organic light emitting display device having uniform organic light emitting layer can be fabricated.

As described above, in one or more embodiments of the invention, a hydrophobic third bank layer having a width smaller than that of the hydrophobic second bank layer is formed in the horizontal direction of the first substrate, e.g., within the pixel columns of the same color, so that the organic light emitting material is uniformly formed in the pixel columns and then the organic light emitting display device having uniform organic light emitting layer can be fabricated.

Many details are set forth in the foregoing description but should be construed as illustrative of preferred embodiments rather than to limit the scope of the invention. Therefore, the invention should not be defined by the described embodiments, but should be defined by the claims and their equivalents.

What is claimed is:

1. An organic light emitting display device, comprising:
   a first substrate;
   a plurality of first bank layers arranged along a first direction and a second direction on the first substrate to define a plurality of pixels;
   a plurality of second bank layers disposed along the first direction on the first bank layers to divide columns of pixels having different colors;
   a plurality of third bank layers disposed along the second direction on the first bank layers; and
   an organic light emitting diode in each pixel, the organic light emitting diode including an organic light emitting layer,
   wherein the third bank layer is made of a same material as the second bank layer, a width of the third bank layer along the second direction is smaller than a width of the second bank layer along the first direction, and a height of the third bank layer is the same as a height of the second bank layer,
   wherein the first bank layer is made of a hydrophilic material, and the second and third bank layers are made of a hydrophobic material,
   wherein the width of the third bank layer increases as a hydrophobic property of the third bank layer becomes stronger, and
   wherein the hydrophobic property of the third bank layer is stronger than a hydrophobic property of the second bank layer.

2. The organic light emitting display device of claim 1, wherein each of the second and third bank layers has the width smaller than a width of the first bank layer to expose an area of the first bank layer, and the organic light emitting layer is disposed on the exposed area of the first bank layer.

3. The organic light emitting display device of claim 1, wherein the second bank layer is integrally formed with the third bank layer.

4. The organic light emitting display device of claim 1, wherein the width of the third bank layer increases as a surface tension of an organic light emitting material of the organic light emitting layer becomes stronger.

5. The organic light emitting display device of claim 1, wherein chamfer inclined surfaces are formed on corners in an upper surface of the third bank layer.

6. The organic light emitting display device of claim 5, wherein the corners in the upper surface of the third bank layer are curved.

7. The organic light emitting display device of claim 1, wherein a thin organic light emitting layer formed integrally with the organic light emitting layer in adjacent pixels is disposed on an upper surface of the third bank layer.

8. The organic light emitting display device of claim 1, wherein the third bank layer is formed in each of columns of the pixels of same color.

\* \* \* \* \*